United States Patent [19]

Ikeda

[11] Patent Number: 4,740,977
[45] Date of Patent: Apr. 26, 1988

[54] SEMICONDUCTOR LASER DEVICE
[75] Inventor: Masao Ikeda, Kanagawa, Japan
[73] Assignee: Sony Corporation, Tokyo, Japan
[21] Appl. No.: 889,961
[22] Filed: Jul. 28, 1986
[30] Foreign Application Priority Data Jul. 26, 1985 [JP] Japan .................................. 60-166325

[51] Int. Cl.⁴ ............................................... H01S 3/19
[52] U.S. Cl. ......................................... 372/45; 372/36; 372/44
[58] Field of Search ............... 372/45, 36, 44; 357/16, 357/17, 61

[56] References Cited

U.S. PATENT DOCUMENTS 3,911,376 10/1975 Thompson ............................ 372/45
4,585,491 4/1986 Burnham et al. ..................... 372/45

Primary Examiner—James W. Davie
Assistant Examiner—Xuan Vo
Attorney, Agent, or Firm—Hill, Van Santen, Steadman & Simpson

[57] ABSTRACT

A semiconductor laser device arranged so that at least one of cladding layers is formed of a thin AlGaInP layer having a larger energy band gap as compared with an active layer adjacent to the active layer and an AlGaAs layer having a high thermal conductivity as compared with that of the AlGaInP layer and the larger energy band gap as compared with the active layer, which is located between the AlGaInP layer and a heat sink, whereby a heat generated in the active layer is effectively radiated to the heat sink, thus the semiconductor laser being made capable of continuously emitting a laser light of a short wavelength at a room temperature.

6 Claims, 1 Drawing Sheet

SEMICONDUCTOR LASER DEVICE

BACKGROUND OF THE INVENTION

1. Field of the Invention

This invention relates generally to a semiconductor laser device which can continuously emit a laser light of a short wavelength band at a room temperature and, more particularly, is directed to an AlGaInP-system semiconductor laser.

2. Description of the Prior Art

Recently, a demand for a semiconductor laser device which can continuously emit a laser light of short wavelength band at the room temperature has occurred.

In, for example, an optical disc such as a so-called compact disc (CD), a video disc and the like, if a laser light of short wavelength is employed as the light source thereof, high density recording becomes possible and also it becomes possible to use a lens system having a small numerical aperture (NA) so that the optical system can be produced at a low cost. Further, since the light from a short wavelength light source is visible light it becomes easy and safe to handle the semiconductor laser. Furthermore, in a laser printer and the like, the photosensitive material has a has high sensitivity in the range of the visible spectrum so that it becomes advantageous to use the short wavelength semiconductor laser as a light source for exposure. For this reason, it is expected that the short wavelength semiconductor laser which can continuously emit a light at room temperature will be produced.

In order to construct the short wavelength semiconductor laser, it is necessary to increase the band gap width of an active layer thereof. In this case, when the material of this active layer is selected, there are various kinds of restrictions, for example, it is necessary to consider a cladding layer for confining a carrier and light into the selected active layer and it is also necessary to consider, from a crystal property standpoint, a lattice constant of a crystal substrate on which the layers are epitaxially grown.

With respect to the short wavelength semiconductor laser of this kind, an AlGaInP/GaAs-system semiconductor laser in which a semiconductor layer of AlGaInP-system is epitaxially grown on an GaAs substrate to thereby construct a semiconductor laser attracts attention as a semiconductor laser with a so-called wavelength band of 600 nm which lies in a range from 580 nm to 680 nm.

This AlGaInP/GaAs semiconductor laser is constructed such that as shown in FIG. 1, on one major surface of a GaAs substrate 1, there are epitaxially grown a first cladding layer 2, an active layer 3, a second cladding layer 4 and a capping layer 5 in this sequentially order. Reference numeral 6 designates an electrode which is deposited in ohomic contact manner on other major surface of the GaAs substrate 1 and reference numeral 7 designates an electrode which is deposited on the capping layer 5 in an ohmic contact fashion. The electrode 7 itself is arranged to have a function as a heat sink. Alternatively, the electrode 7 is soldered through a solder layer 8 to a heat sink, that is, a radiator 9.

The layers 2 to 4 are made of material having the composition shown by the following general formula.

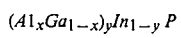

$$(Al_xGa_{1-x})_yIn_{1-y}P \qquad (1)$$

The active layer 3 is made of $Ga_{0.52}In_{0.48}P$ having a thickness of, for example, 0.1 μm to 0.2 μm. The first and second cladding layers 2 and 4 are each made of an AlGaInP-system semiconductor layer having a band gap width (forbidden band width) larger than that of the active layer 3 by about 0.3 eV. Specifically, they are each made of, for example, $Al_{0.26}Ga_{0.26}In_{0.48}P$ of which the Al content (value of x in formula (1)) is larger than 0.3, more preferably larger than 0.5. Each thickness of these layers 2 and 4 is selected to be more than 0.8 μm which is thick enough to confine the carrier and the light within the active layer 3, for example, 1 μm. Further, the capping layer 5 is made of, for example, a GaAs layer.

The AlGaInP/GaAs-system semiconductor laser with the above construction emits a laser light of a short wavelength of, 653 nm. In this case, this semiconductor laser can continuously emit a laser light at a temperature of 228° K. but can not do it at room temperture.

The reason that this semiconductor laser can not continuously emit the laser light at room temperature is because the heat generated in the active layer 3 during operation is not conducted effectively to the heat sink 9.

For example, in a semiconductor laser, with respect to the InGaAsP/GaAs-system, a semiconductor laser formed as a mesa-type structure and thereby capable of continuously emitting a laser light at room temperature is disclosed, for example, in "Nikkei Electronics, 1985, May 20, PP. 151 to 153", "Nikkei Micro Device, 1985, summer edition, PP. 21 to 23" and "Electronics Letters, 1985, January 17, Vol. 21, No. 2, PP. 54 to 56". According to this mesa-type semiconductor laser, grooves are formed, which enter a cladding layer on which a metal electrode, which becomes a heat sink, is deposited. On the upper surface of the mesa-type semiconductor laser opposite to the GaAs substrate, the metal electrode is deposited so as to include the inside of these grooves, whereby the metal electrode having the heat sink effect approaches the active layer as near as possible. Thus, the heat generated from the active layer can be radiated effectively to thereby enable the semiconductor laser to continuously emit laser light at room temperature.

However, the fact that the electrode exists very near the active layer as described above causes problem of a leakage current. Further, from a technical standpoint, it is difficult to form such grooves so so that they are spaced apart from the active layer by a proper distance and with a proper depth to sufficiently approach the active layer without the occurrence of leakage current. There is a problem that the semiconductor laser having a uniform characteristic cannot mass-produced.

OBJECTS AND SUMMARY OF THE INVENTION

Accordingly, it is an object of this invention to provide an improved semiconductor laser which can remove the above mentioned defects encountered with the prior art semiconductor laser.

It is another object of this invention to provide an improved semiconductor laser which is not formed as a mesa-type structure and which can continuously emit a laser light of a so-called short wavelength in the 600 nm band ranging from 580 nm to 680 nm at a room temperature.

According to one aspect of the present invention, there is provided a semicondcutor laser comprising:

(a) a substrate;

(b) a first cladding layer formed on one surface of said substrate;

(c) an active layer formed on said first cladding layer;

(d) a second cladding layer formed on said active layer;

(e) a capping layer formed on said second cladding layer;

(f) a first electrode deposited on the other surface of said substrate; and (g) a second electrode deposited on said capping layer, in which said second cladding layer is formed of first and second layers, said first layer being located adjacent said active layer and, having an energy band gap width larger than that of said active layer and a thickness which is thin enough to produce a carrier confinement effect for said active layer, and said second layer is formed on said first layer and made of a layer having a thermal conductivity higher than that of said first layer, a refractive index smaller than that of said active layer and produces a high confinement effect for said active layer.

These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENT

Figure 1:
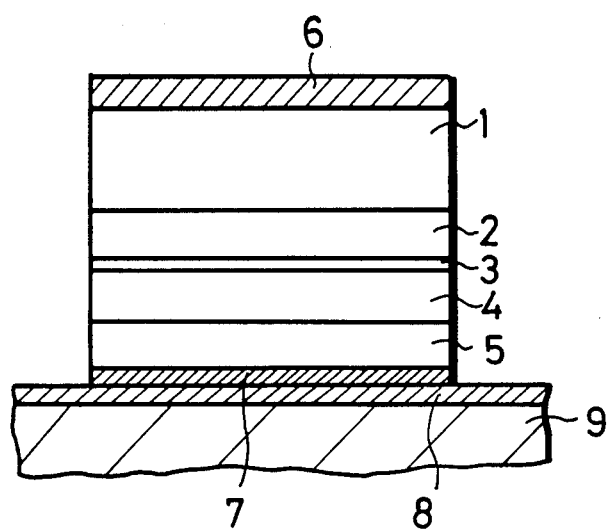
FIG. 1 is a schematic enlarged cross-sectional view illustrating one example of a prior art semiconductor laser.
Figure 2:
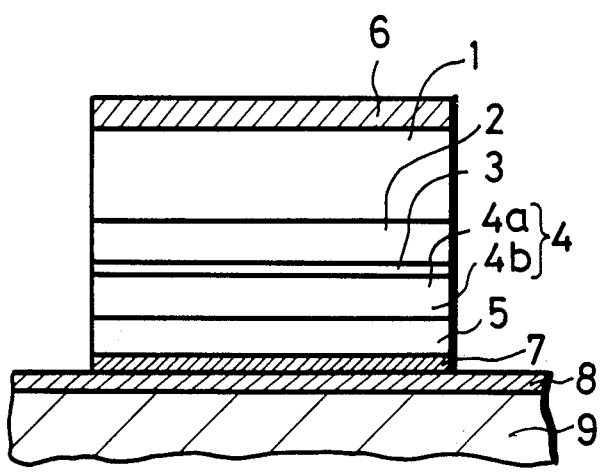
FIG. 2 is a schematic enlarged cross-sectional view illustrating one embodiment of a semiconductor laser according to the present invention.

Now, an embodiment of a semiconductor laser according to the present invention will be described hereinafter. FIG. 2 is a schematic enlarged cross-sectional view illustrating an embodiment of the semiconductor laser according to the invention. In FIG. 2, like parts corresponding to those in FIG. 1 are marked with the same references and will not be described in detail.

Referring to FIG. 2, on a GaAs substrate 1, there are epitaxially grown the first cladding layer 2 through a buffer layer (not shown) made of, for example, GaAs, if necessary, the active layer 3, the second cladding layer 4 and the capping layer 5.

Particularly in accordance with the present invention, the cladding layer has at least the heat sink function. That is, the second cladding layer 4 is formed of an AlGaInP layer 4a adjoining the active layer 3 and an AlGaAs layer 4b adjoining the AlGaInP layer 4a whose thermal conductivity is higher than that of the AlGaInP layer 4a. In other words, the layer 4a adjacent to the active layer 3 is formed of the AlGaInP layer whose energy band gap width is sufficiently large as compared with the active layer 3, the thickness thereof is made sufficiently thin at least having the effect to confine the carrier within the active layer 3. That is, the thickness of the layer 4a is selected to be more than several 100 s Å, for example, in a range from 0.1 to 0.3 μm in which it is not so strongly required that the light confinement function be as effective. On the other hand, with respect to the layer 4b, it is required that the band gap width be large as compared with that of the active layer 3 and that the refractive index be smaller than that of the active layer 3. However, it is not necessary that the band gap difference between the layer 4b and the active layer 3 be large enough to effect the carrier confinement function. This layer 4b is formed of an AlGaAs layer. Then, the thickness of this AlGaAs layer 4b is selected to be such that at least the light can be confined within the active layer 3 in cooperation with the AlGaInP layer 4a.

That is, according to the present invention, in the mixed crystal semiconductor, due to with the fact that the more complex the mixed crystal becomes the lower the thermal conductivity becomes, the layer 4a of four elements of the mixed crystal AlGaInP system having a low thermal conductivity exists between the active layer 3 and the heat sink 9 only as a part of a thin layer in the cladding layer. Accordingly, the heat generated from the active layer 3 is effectively conducted to the heat sink 9 through the layer 4b having a high thermal conductivity and the function as the cladding layer 4, particularly the light confinement function which is lowered when the AlGaInP layer 4a is made thin can be compensated by the cooperation of the AlGaAs layer 4b having a light confinement effect. Thus, the short wavelength semiconductor laser can continuously emit a laser light at room temperature.

The embodiment of the present invention will be described more fully with reference to FIG. 2. In the illustrated example, on the GaAs substrate 1, there are epitaxially grown the first cladding layer 2, the active layer 3 and one layer 4a of the second cladding layer 4 by semiconductor layers of the AlGaInP. On the layer 4a, there is epitaxially grown the AlGaAs layer 4b on which the capping layer 5 made of GaAs is epitaxially grown. These layers 2, 3, 4a, 4b and 5 can be continuously epitaxially grown by a series of processes by an epitaxy method using, for example, metal organic compound, that is, so-called MOCVD (metal organic chemical vapour deposition) method or so-called MBE (molecular beam epitaxy) method and the like.

On the other surface of the GaAs substrate 1, there is deposited one electrode 6 in ohmic contact and another electrode 7 is deposited on the capping layer 5 in ohmic contact. Then, the side of the electrode 7 is closely coupled through the solder layer 8 to the heat sink 9 so as to have good thermal conductivity.

The electrode 7 is made of, for example, Au-Zn layer or is formed as a multilayer structure in which a Ti layer is formed on the Au layer. This electrode 7 is melt-bonded through the solder layer 8 such as Sn, Sn-Pb, In and the like to the heat sink 9.

The first cladding layer 2, the active layer 3 and the layer 4a of the second cladding layer 4 have compositions expressed by the afore-mentioned formula (1), in which the value y is selected, for example, in a range of 0.51 to 0.52, the lattice constant thereof is selected to have a value nearly equal to that of the GaAs substrate 1 and the crystal layer is epitaxially grown so as to be matched with the GaAs substrate 1.

The active layer 3 can be formed of a semiconductor layer having a thickness of, for example, 0.1 to 0.2 μm and in which the band gap of $Ga_{0.52}In_{0.48}P$ where $x=0$ is satisfied in the above mentioned formula (1) is 1.9 eV. At that time, the first cladding layer 2 and the layer 4a of the second cladding layer 4 are formed of the AlGaInP semiconductor layers which have large band gaps as compared with that of the active layer 3 and the difference therebetween becomes more than 0.3 eV, for example, $Al_{0.26} Ga_{0.26} In_{0.48} P$ where $x=0.5$ is satisfied in the compositions expressed by the above formula (1). In this case, the thickness of the first cladding layer 2 made of a single layer is selected to be such so as to effect the light and carrier confinement, for example, 1 μm. Further, the thickness of the AlGaInP-system layer 4a of the second cladding layer 4 is selected to be such so as to carry out the carrier confinement, for example, as thin as more than several 100 s Å, preferably, in a range from 0.1 to 0.3 μm.

In the second cladding layer 4, the AlGaAs layer 4b has a band gap width larger than the band gap width of the active layer 3, for example, a band gap width of 2.0 to 2.17eV. This AlGaAs layer 4b can be formed of, for example, $Al_{0.8} Ga_{0.2} As$ (the band gap width is 2.1eV) in the composition formula expressed as $$(Al_z Ga_{1-z}) As \quad (2)$$

where $0.6 \leq z \leq 1$ is satisfied.

The thickness of this AlGaAs layer 4b is selected to be such that the light can be confined within the active layer 3. In practice, the thickness of the layer 4b is selected to be more than 0.8 μm and the sum of the thickness of the layer 4b and the thickness of the layer 4a becomes more than 1 μm.

While in the above mentioned embodiment only the second cladding layer 4 at the side of the heat sink 9 is composed of the layers 4a and 4b, both the cladding layers 2 and 4 may be made of a thin AlGaInP-system layer which can carry out the carrier confinement and an AlGaAs-system layer having the high thermal conductivity which can be used for carrying out the light confinement.

According to the present invention as set forth above, in the cladding layer interposed between the active layer 3 and the side of the heat sink 9 the AlGaInP-system semiconductor layer 4a, which is low in thermal conductivity, is formed to be thin and the light confinement function is mainly done by the AlGaAs layer 4b which is high in thermal conductivity so that the short wavelength semiconductor laser made of AlGaInP-system material can continuously emit a laser light at room temperature due to the effective heat radiation action.

Further, according to the structure of the invention, since the semiconductor laser is formed as a planar-type structure having no groove, there can be achieved many advantages such as, the semiconductor laser can be easily manufactured; and the short wavelength semiconductor laser having the uniform and stable characteristics can be mass-produced.

The above description is given for a single preferred embodiment of the invention but it will be apparent that many modifications and variations could be effected by one skilled in the art without departing from the spirits or scope of the novel concepts of the invention so that the scope of the invention should be determined by the appended claims only.

I claim as my invention:

1. A laser device having a resonant cavity wherein the improvement comprises, a semiconductor laser device comprising:
   (a) substrate;
   (b) a first cladding layer formed on one surface of said substrate;
   (c) an active layer formed on said first cladding layer;
   (d) a second cladding layer formed on said active layer;
   (e) a capping layer formed on said second cladding layer;
   (f) a first electrode deposited on the other surface of said substrate; and
   (g) a second electrode deposited on said capping layer, in which said second cladding layer has an energy band gap width larger than that of said active layer and is formed of a first layer adjacent said active layer and a second layer having a thermal conductivity higher than that of said first layer wherein said active layer and said first cladding layer and said first layer of said second cladding area are formed of multi-element compound crystals and said second layer of said second cladding layer is a compound crystal containing fewer elements than said active layer, and said first layer of said second cladding layer.

2. A laser device having a resonant cavity wherein the improvement comprises, a semiconductor laser device comprising: a substrate; a first cladding layer formed on one surface of said substrate; an active layer formed on said first cladding layer; a second cladding layer formed on said active layer; a capping layer formed on said second cladding layer; a first electrode deposited on the other surface of said subtrate; and a second electrode deposited on said capping layer, in which said second cladding layer has an energy band gap width larger than that of said active layer and is formed of a first layer adjacent said active layer and a second layer having a thermal conductivity higher than that of said first layer wherein said active layer and said first cladding layer and said first layer of said second cladding area are formed of multi-element compound crystals and said second layer of said second cladding layer is a compound crystal containing fewer elements than said active layer, and said first layer of said second cladding layer, and wherein said first layer is made of a material which is expressed as $$(Al_x Ga_{1-x})_y In_{1-y}$$

where y is selected as 0.51 to 0.52.

3. A laser device having a resonant cavity wherein the improvement comprises, a semiconductor laser device comprising: a substrate; a first cladding layer formed on one surface of said substrate; an active layer formed on said first cladding layer; a second cladding layer formed on said active layer; a capping layer formed on said second cladding layer; a first electrode deposited on the other surface of said substrate; and a second electrode deposited on said capping layer, in which said second cladding layer has an energy band gap width larger than that of said active layer and is formed of a first layer adjacent said active layer and a second layer having a thermal conductivity higher than that of said first layer wherein said active layer and said first cladding layer and said first layer of said second cladding area are formed of multi-element compound crystals and said second layer of said second cladding layer is a compound crystal containing fewer elements than said active layer, and said first layer of said second cladding layer, and, wherein said second layer is made of a material which is expressed as $$(Al_z Ga_{1-z}) As$$

where $0.6 \leq z \leq 1$ is established.

4. A semiconductor laser device according to claim 1, wherein a thickness of said first layer is selected in a range from 0.1 to 0.3 μm.

5. A semiconductor laser device according to claim 1, wherein a thickness of said second layer is selected to be more than 0.8 μm.

6. A semiconductor laser device according to claim 4 or 5, wherein a sum of thicknesses of said first and second layers is selected to be more than 1 μm.

* * * * *